(12) United States Patent
Sheng et al.

(10) Patent No.: US 8,788,226 B2
(45) Date of Patent: *Jul. 22, 2014

(54) BATTERY TESTER WITH HIGH PRECISION

(75) Inventors: Hsien-Fang Sheng, Taipei (TW);
Yuan-Chen Hsiao, Taipei (TW)

(73) Assignee: DHC, Speciality Corp., Taipei (TW)

( * ) Notice: Subject to any disclaimer, the term of this patent is extended or adjusted under 35 U.S.C. 154(b) by 485 days.

This patent is subject to a terminal disclaimer.

(21) Appl. No.: 13/069,054

(22) Filed: Mar. 22, 2011

(65) Prior Publication Data
US 2012/0245872 A1 Sep. 27, 2012

(51) Int. Cl.
*G06F 19/00* (2011.01)
*G01R 19/00* (2006.01)
*G01R 31/36* (2006.01)

(52) U.S. Cl.
CPC ........ *G01R 31/3631* (2013.01); *G01R 31/3648* (2013.01); *G01R 31/3679* (2013.01)
USPC ............................................ 702/63; 324/426

(58) Field of Classification Search
USPC ......................................................... 702/63
See application file for complete search history.

(56) References Cited

U.S. PATENT DOCUMENTS

| | | | | |
|---|---|---|---|---|
| 6,424,158 | B2 * | 7/2002 | Klang | 324/433 |
| 6,469,512 | B2 * | 10/2002 | Singh et al. | 324/426 |
| 6,885,167 | B2 * | 4/2005 | Palanisamy et al. | 320/104 |
| 7,743,649 | B1 * | 6/2010 | Salman et al. | 73/114.59 |
| 7,902,828 | B2 * | 3/2011 | Huang | 324/430 |
| 2006/0244457 | A1 * | 11/2006 | Henningson et al. | 324/426 |

OTHER PUBLICATIONS

Magger; Battery Test Guide; 2009.*

* cited by examiner

*Primary Examiner* — Andrew Schechter
*Assistant Examiner* — Daniel Kessie
(74) *Attorney, Agent, or Firm* — Abe Hershkovitz; Hershkovitz & Associates, PLLC

(57) ABSTRACT

The present invention discloses a battery tester having high precision, which has a casing having an input device and two detecting wires, a microprocessor, a variable loading unit and a battery power status detecting unit. The microprocessor builds a strategic decision process therein to determine a proper resistance of a load for a battery according to the battery capacity, initial voltage and detection requirements having 1/N CCA and loading time. When the resistance of the load is determined, the microprocessor adjusts a resistance of the variable loading unit equal to the resistance of the load for the battery. Therefore, the battery tester does not use the load with the fixed resistance to detect batteries with different capacities and has accurate detecting results.

9 Claims, 10 Drawing Sheets

BATTERY TESTER WITH HIGH PRECISION

BACKGROUND OF THE INVENTION

1. Field of the Invention

The present invention relates to the field of a battery tester, and more particularly to a battery tester providing high precision detecting results.

2. Description of Related Art

There are many types of the rechargeable battery with different capacities on the market. The battery tester is used to detect the residual capacity of the rechargeable battery to determine the health of the rechargeable battery. However, the conventional battery tester uses only one method to detect different rechargeable batteries and inaccurate testing result will likely occur.

In general, the conventional battery tester uses ½ Cold Cranking Amps (hereinafter CCA) testing method to detect the health of the rechargeable battery, the method having steps of: (a) adding a load to the two electrodes of the battery to discharge the battery by loading the amperes of ½ CCA for 15 seconds; and (b) determining the health of the battery according to the discharging diagram.

In the conventional testing method implemented by the battery tester, the resistance of the load and the duration of adding load to the battery are fixed. Therefore, when the battery tester respectively detects rechargeable batteries with different capacities, figures of the discharging diagrams are not precise. The testing precision of the conventional battery tester is not ideal for all rechargeable batteries.

To overcome the shortcomings, the present invention provides a battery tester with high precision to mitigate or obviate the aforementioned problems.

SUMMARY OF THE INVENTION

Based on the foregoing drawbacks of the conventional battery tester, the main objective of the present invention is to provide a battery tester with high precision.

The battery tester has a casing having an input device and two detecting wires, a microprocessor, a variable loading unit and a battery power status detecting unit. The microprocessor builds a strategic decision process therein to determine a proper resistance of a load for a battery according to the $CCA_B$, the battery voltage and a 1/N CCA and a loading time inputted from the input device. When the resistance of the load is determined, the microprocessor adjusts a resistance of the variable loading unit in accordance with the calculated loading resistance. The microprocessor further executes a detecting process to obtain a detecting waveform to determine the battery status. Therefore, the battery tester does not use the load with a fixed resistance to detect batteries with different capacities and has accurate detecting results.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
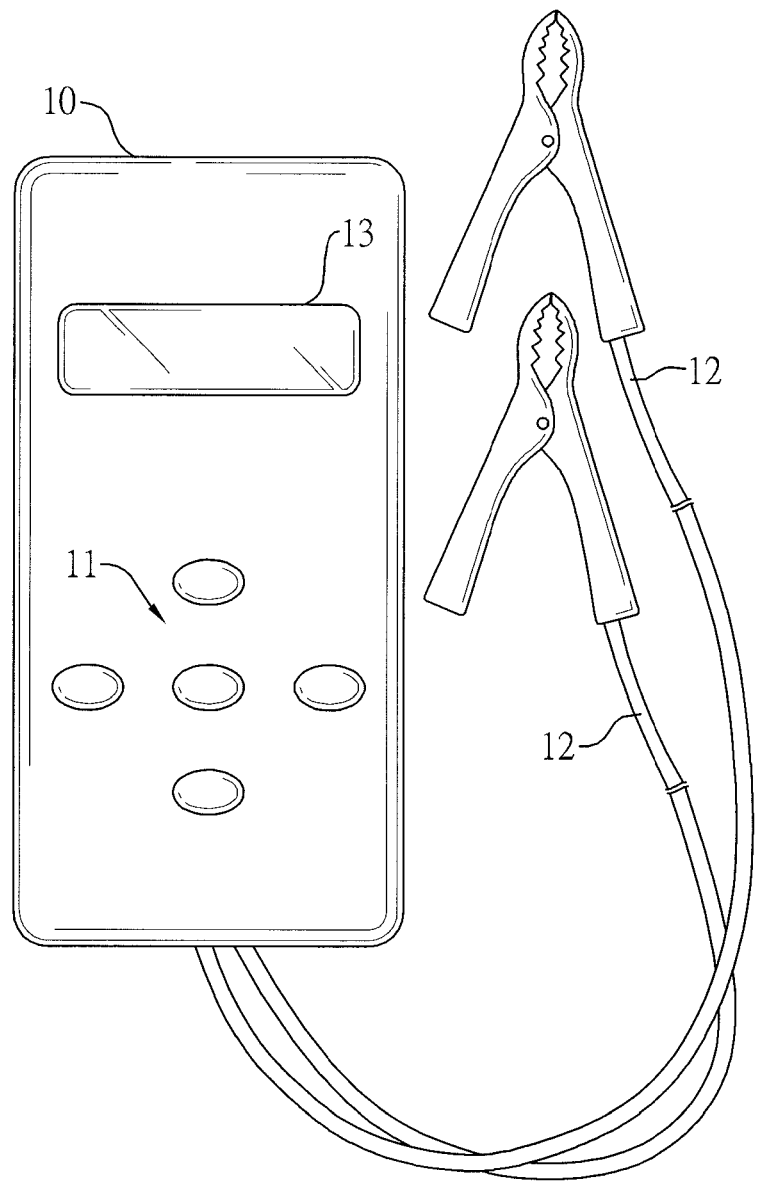
FIG. 1 is a perspective view of a battery tester in accordance with the present invention.
Figure 2:
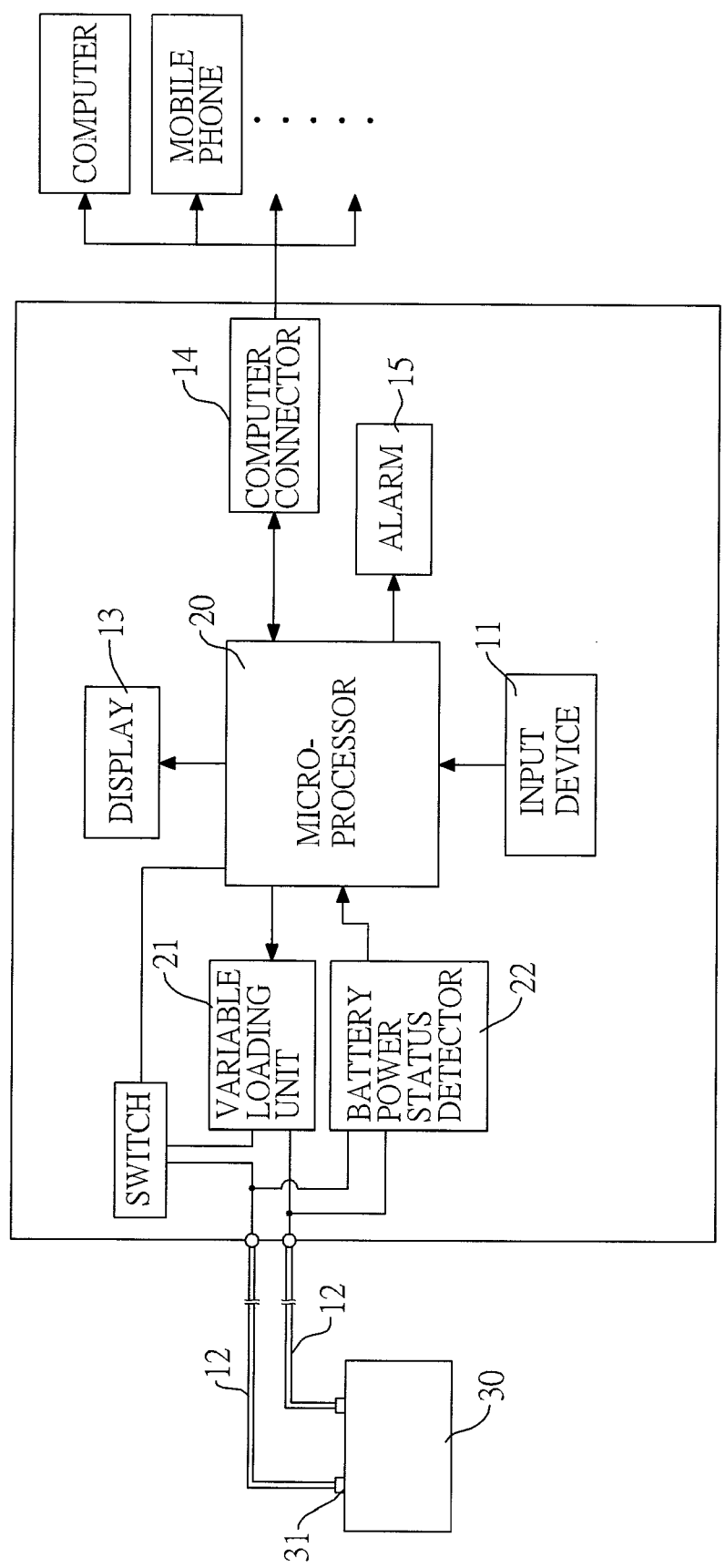
FIG. 2 is a functional block diagram of a first embodiment of a battery tester in accordance with the present invention.

With reference to FIGS. 1 and 2, a first embodiment of a battery tester with high precision in accordance with the present invention has a casing 10, a microprocessor 20, a variable loading unit 21 and a battery power status detecting unit 22.

The casing 10 has an input device 11 and two detecting wires 12. A user uses the input device 11 to select a specific battery capacity. The detecting wires 12 are respectively and electronically connected to two electrodes 31 of the battery 30. In the first embodiment, the two detecting wires 12 respectively clip to the two electrodes 31 of the battery 30. In addition, the casing 10 further has a display 13, a computer connector 14 and an alarm 15. The computer connector 14 is used to connect to an external electronic device such as a computer or mobile phone.

The microprocessor 20 builds a strategic decision process and a detecting process therein.

The variable load unit 21 is electronically connected to the microprocessor 20 and the electrodes 31 of the battery 30 to detect voltage and current changes of the battery 30 and then responds with the voltage and current values to the microprocessor 20.

The battery power status detecting unit 22 is connected between the detecting wires 12 and the microprocessor 20 to detect the battery voltage value and/or current value. Further, the battery power status detecting unit 22 may be built-in the microprocessor 20.

Figure 3:
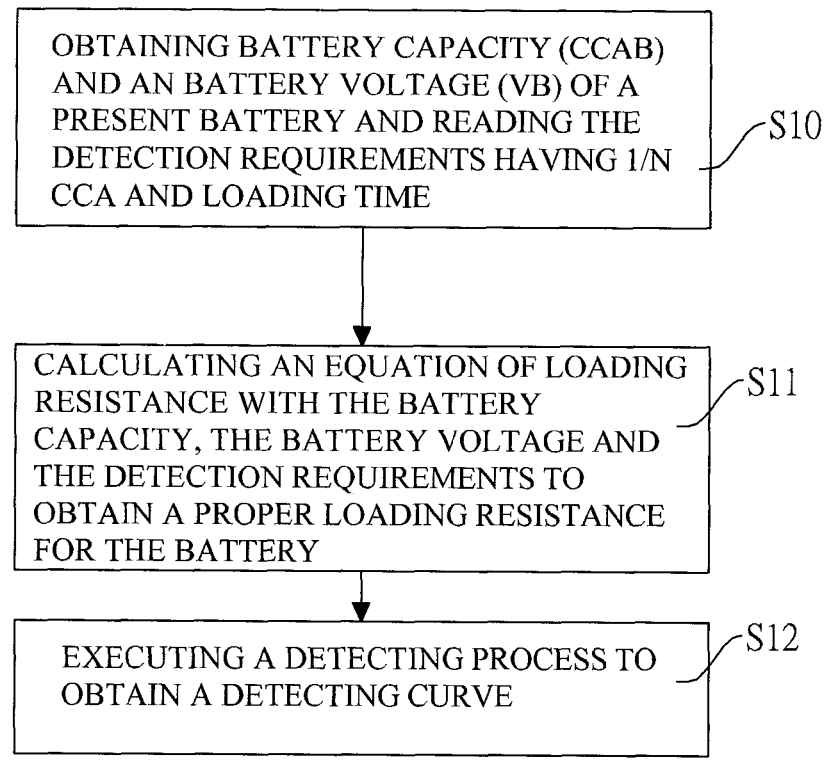
FIG. 3 is a flow chart of a strategic decision process in testing mode implemented in FIG. 1.

With further reference to FIG. 3, the microprocessor 20 executes the strategic decision process and has the following steps of:

(a) obtaining $CCA_B$ inputted from the input device 11, the battery voltage ($V_B$) of a present battery from the battery power status unit 22, and a 1/N CCA and a loading time inputted from the input device 11 (S10);

(b) calculating an equation of loading resistance with the battery capacity, the initial voltage and the detection requirements to obtain a proper loading resistance for the present battery 30 (S11), wherein the equation is $$\frac{V_B}{CCA_B \times \frac{1}{N}},$$

and adjusting a resistance of the variable loading unit 21 in accordance with the calculated loading resistance; and (c) executing a detecting process to obtain a detecting waveform (S12).

Figure 4:
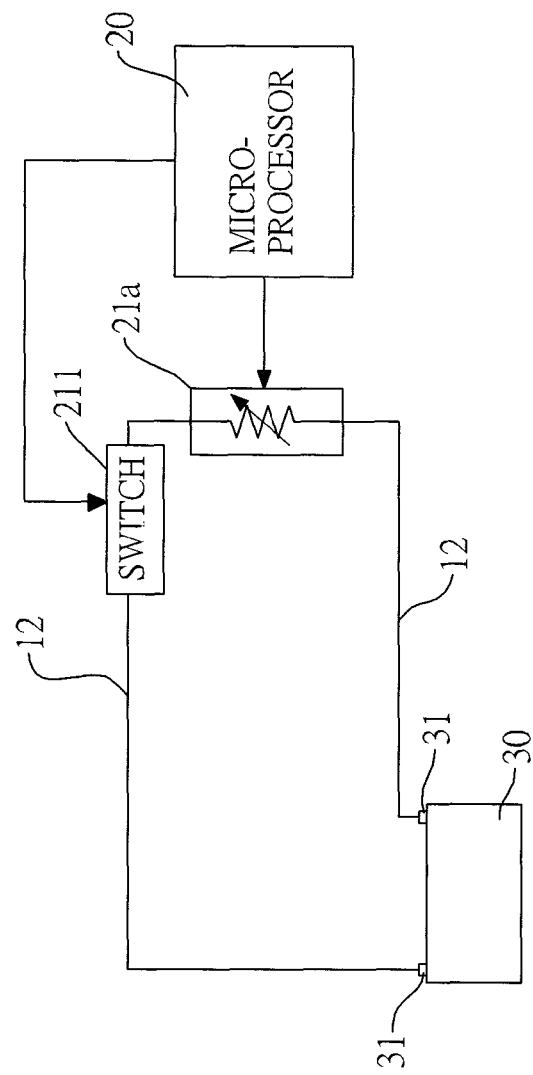
FIG. 4 is a circuit diagram of a first embodiment of a variable load unit of the battery tester in accordance with the present invention.

With reference to FIG. 4, the variable loading unit 21 has a variable resistor 21a and a switch 211. The variable resistor 21a is electronically connected to the detecting wires 12. The variable resistor 21a is electronically connected to the microprocessor 20. The switch 211 is electronically connected between one of the detecting wire 12 and the corresponding end of the variable resistor 21a. The microprocessor 20 adjusts resistance of the variable resistor 21a. The microprocessor 20 further controls the switch 211 to be turned on or off.

For example, if the user detects the health of the present battery 30 with 12 V/1000 CCA, the user may select ½ CCA to detect the battery 30 by the input device 11. Therefore, the microprocessor 20 of the battery tester obtains detection requirements: $CCA_B$=1000 CCA, $V_B$=12V, 1/N CCA=½ CCA, so a proper loading resistance is calculated by the equation of loading resistance and the resistance will be 0.024 ohm. The microprocessor 20 controls the variable resistor 21a to adjust the resistance of the variable resistor 21a to be 0.024 ohm. When the detecting wires 12 are used to clip to the electrodes 31 of the battery 30, the variable resistor 21a with 0.024 ohm is added to the battery 30.

In another example, if the user detects the health of the present battery 30 with 12 V/900 CCA, the user may select ⅓ CCA to detect the battery 30 by the input device 11. Therefore, the microprocessor 20 of the battery tester obtains detection requirements: $CCA_B$=900 CCA, $V_B$=12V, 1/N CCA=⅓ CCA, so a proper loading resistance is calculated by the equation of loading resistance and the resistance will be 0.04 ohm. The microprocessor 20 controls the variable resistor 21a to adjust the resistance of the variable resistor to be 0.04 ohm. When the detecting wires 12 clip to the electrodes of the battery 30, the variable resistor with 0.04 ohm is added to the battery 30.

Based on the above two examples, the resistance of the variable resistor can be changed according to the different capacities of the batteries.

Figure 5A:
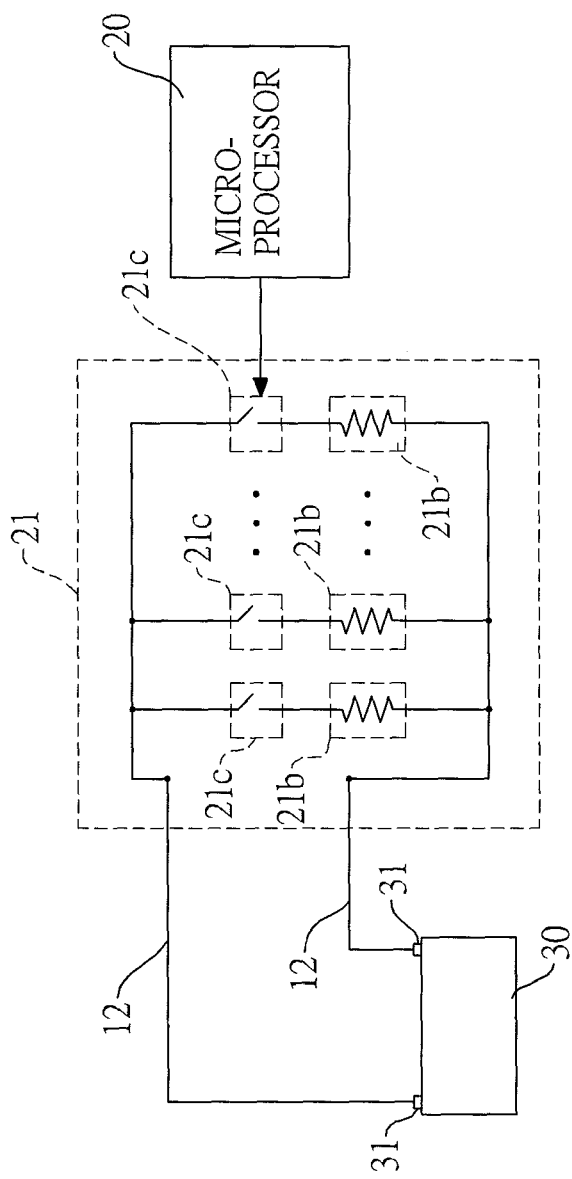
FIG. 5A is a circuit diagram of a first embodiment of a variable load unit of the battery tester in accordance with the present invention.

With further reference to FIG. 5A, another embodiment of the variable loading unit 21 has multiple resistors 21b and switching elements 21c. First ends of the resistors 21b are electronically connected to the detecting wires 12 and second ends of the resistors 21b are respectively and electronically connected to the other detecting wire 12 through the corresponding switching elements 21c. The switching elements 21c are electronically connected to the microprocessor 20. The microprocessor 20 drives each switching element 21c to be turned on or turned off to determine which one resistor 21b is connected to the two electrodes 31 of the battery 30, or which resistors 21b are electronically and parallelly connected to the two electrodes 31 of the battery 30. When a proper loading resistance is determined by the microprocessor 20, the microprocessor 20 drives one or more switching elements 21c to be turned on according to the loading resistance. If two or more switching elements 21c are driven to be turned on at the same time, the resistance of the variable loading unit is smaller than that of one of the resistors 21b.

Figure 5B:
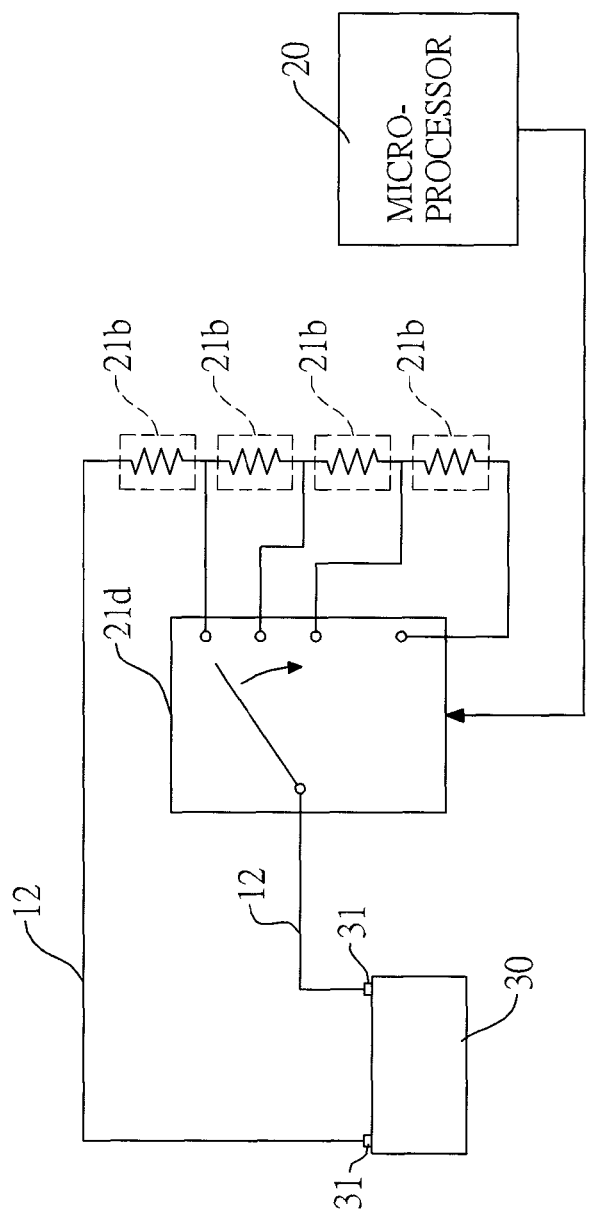
FIG. 5B is a circuit diagram of a second embodiment of a variable load unit of the battery tester in accordance with the present invention.
Figure 5C:
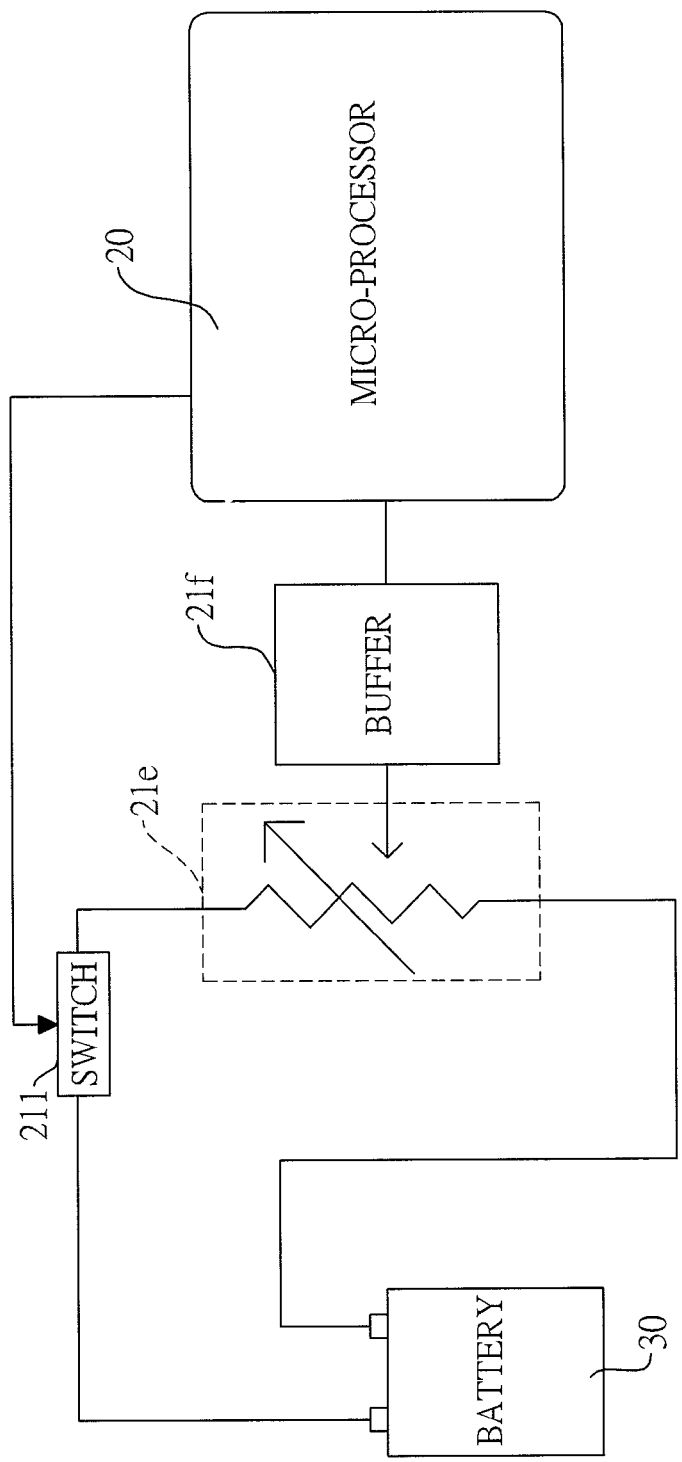
FIG. 5C is a circuit diagram of a third embodiment of a variable load unit of the battery tester in accordance with the present invention.
Figure 6:
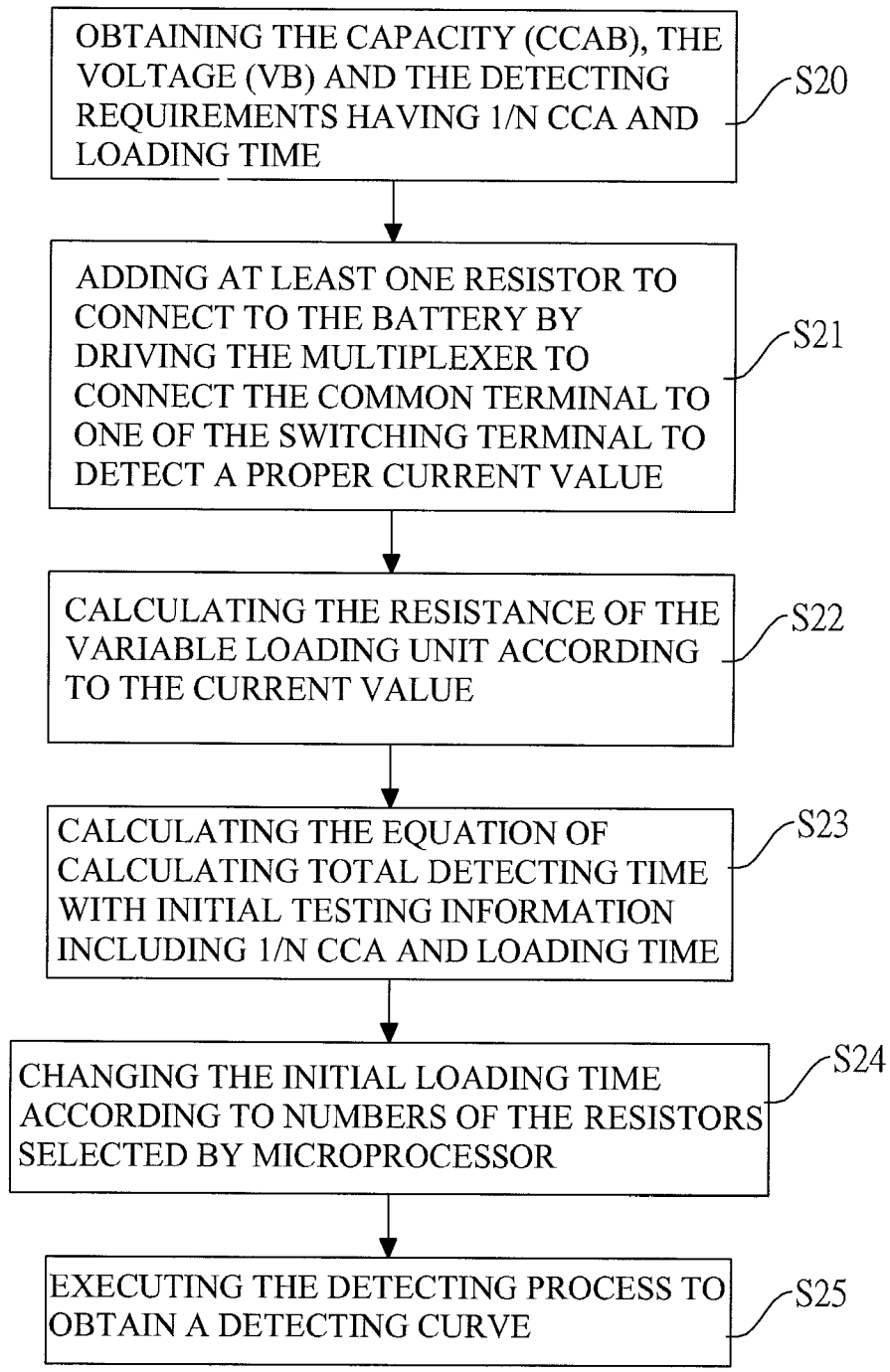
FIG. 6 is a flow chart of a strategic decision process in a first detecting mode implemented in FIGS. 5A, 5B and 5C in accordance with the present invention.

With reference to FIG. 5C, another embodiment of the variable loading unit has a programmable variable resistor 21e and a switch 211. The programmable variable resistor 21e is electronically connected to the detecting wires 12. A controlling end of the program variable resistor 21e is connected to the microprocessor 20. The microprocessor 20 directly adjusts the resistance of the programmable variable resistor 21e and drives the switch 211 to be turned on or off to determine whether the programmable variable resistor 21e is connected to the battery 30 or not. In addition, the microprocessor 20 is connected to the controlling end of the programmable variable resistor 21e through a buffer 21f.

For example, if the resistors 21b have the same resistance as in FIG. 5A, and the resistance is 0.08 ohm, one battery with 12V/750 CCA is detected by the battery tester as shown in FIG. 5A. The user uses the input device 11 to select the ½ CCA and 15 sec loading time to enter the testing process.

Since the resistors 21b have the same resistance, the loading of the battery is 0.08 ohm when the microprocessor 20 drives one of the switches 21c to be turned on. The microprocessor 20 has a power status detecting unit 22 to detect a present current value of the battery 30 with 0.08 ohm. When the current value is equal to 100 A, the microprocessor 20 calculates a proper loading resistance and the calculating process has the following steps of:

(a) calculating the numbers of the resistors with 0.08 ohm; wherein [750*(½)]/100=3.75; and (b) calculating a total detecting power by ½ CCA and 15 sec, wherein the total detecting power is [750*(½)]*15=5625 (A−sec).

Since the microprocessor 20 just selects 3 resistors 21b to parallelly connect to the battery 30, the initial detection requirements input by the user are changed. A new loading time is changed to 18.75 sec as calculated by an equation: 5625/300=18.75 sec.

In this example, the microprocessor 20 turns on 3 switches 21c, and the 3 resistors 21b are electronically and parallelly connected to the battery 30 for 18.75 sec.

With further reference to FIG. 5B, another embodiment of the variable loading unit has multiple resistors 21b connected in serial and a 1 to X multiplexer 21d having one common terminal COM and X switching terminals $S_1$ to $S_x$. X is the number of the resistors 21b. One end A of the series of the resistors is connected to one detecting wire 12 and the other detecting wire 12 is connected to the common terminal COM of the multiplexer 21d. The switching terminals $S_1$ to $S_x$ of the multiplexer 21d are respectively connected to serial nodes of the series of the resistors 21b and the other end B of the series of the resistors 21b. The microprocessor 20 drives the common terminal COM to connect to one of the switching terminals $S_1$ to $S_x$ to determine a resistance of the variable loading unit.

For example, the resistors 21b have the same resistance (0.08 ohm) and a battery with 12V/1000 CCA is detected. The user selects ½ CCA and 15 sec loading time to detect the health of the battery 30.

Since the variable loading unit has multiple resistors 21b, one resistor 21b is first connected to the battery 30 by driving the multiplexer 21d and detects whether a present current value achieves 12/0.08=150 A. If the current value achieves 150 A, the microprocessor 20 further calculates a proper loading for the present battery 30. The calculating process has the following steps of:

(a) 1000/2*15=7500(A−sec); and (b) 75000/150=50(sec).

When the microprocessor 20 executes the loading process, the microprocessor 20 drives multiplexer 21d and the common terminal COM is connected to a first switching terminal S$_1$. One resistor 21b is selected to connect to the battery 30 through the detecting wires 12. In addition, the initial loading time (15 sec) is changed to 50 sec as a new loading time.

For another example, to detect another battery 30 with 12V/100 CCA, the microprocessor 20 drives the multiplexer 21d and selects 3 resistors 21b to connect to the battery 30 to detect the present current value (12V/0.24=50 A). According to the present current value, the microprocessor 20 calculates a proper loading resistance. The calculating method has the following steps of:
- (a) 100/2*15=750(A); and
- (b) 750/50=15 (sec), wherein the final loading time is equal to the initial loading time selected by the user: the loading time is not changed.

When the microprocessor 20 executes the loading process, the microprocessor 20 drives multiplexer 21d, and the common terminal COM is connected to a third switching terminal S3. The series of the three resistors 21b is selected to connect to the battery 30 through the detecting wires 12 to detect aging of the battery 30.

Based on the foregoing description, the variable loading unit 21 has multiple resistors 21b but the microprocessor 20 executes the strategic decision process to adjust the numbers of the resistors 21b and changes the initial loading time selected by the user. Therefore, the microprocessor 20 still obtains accuracy, detecting waveforms for the battery 30 with different capacities.

Figure 7:
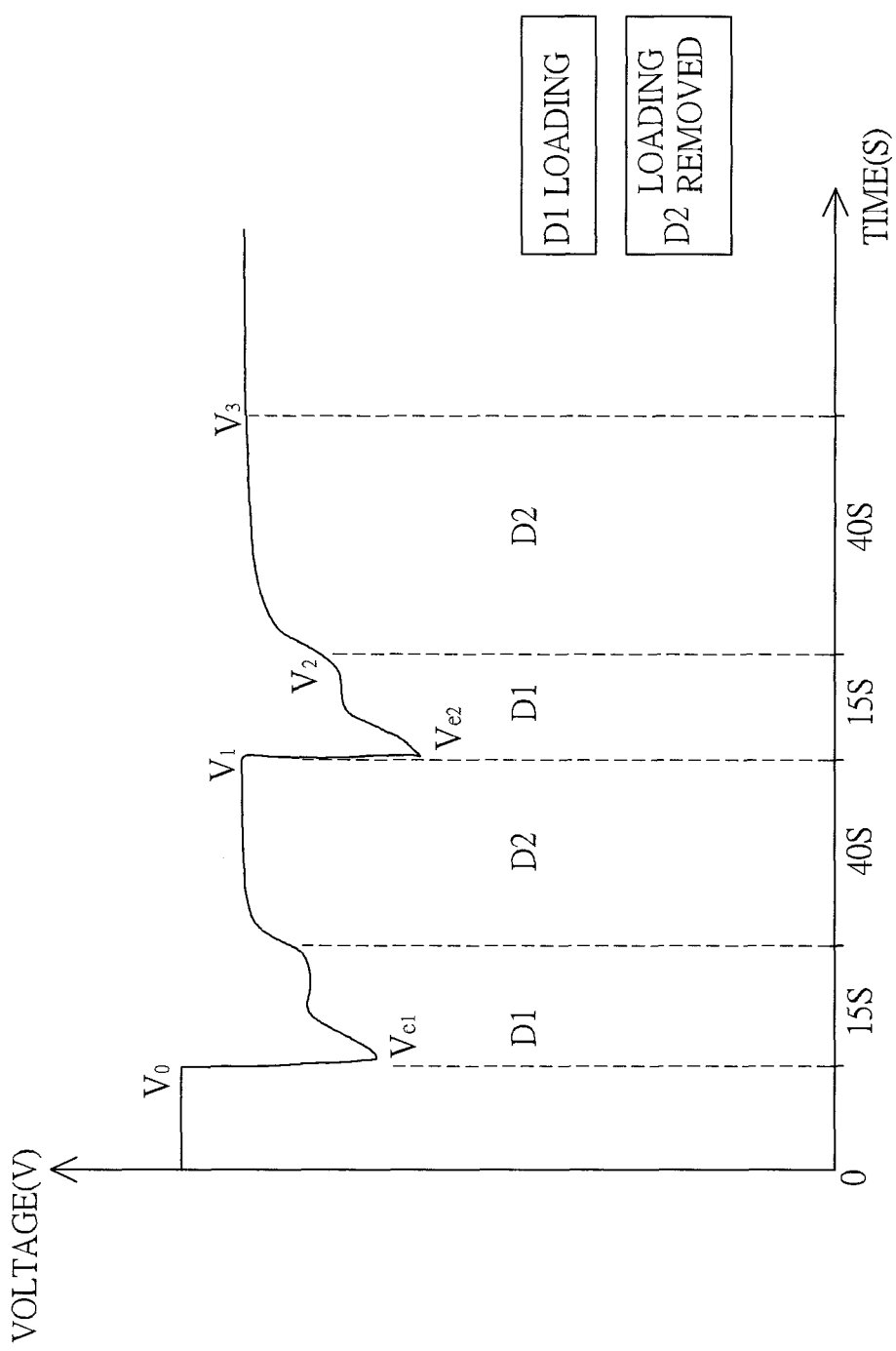
FIG. 7 is a testing diagram of the battery tester in accordance with the present invention.
Figure 8:
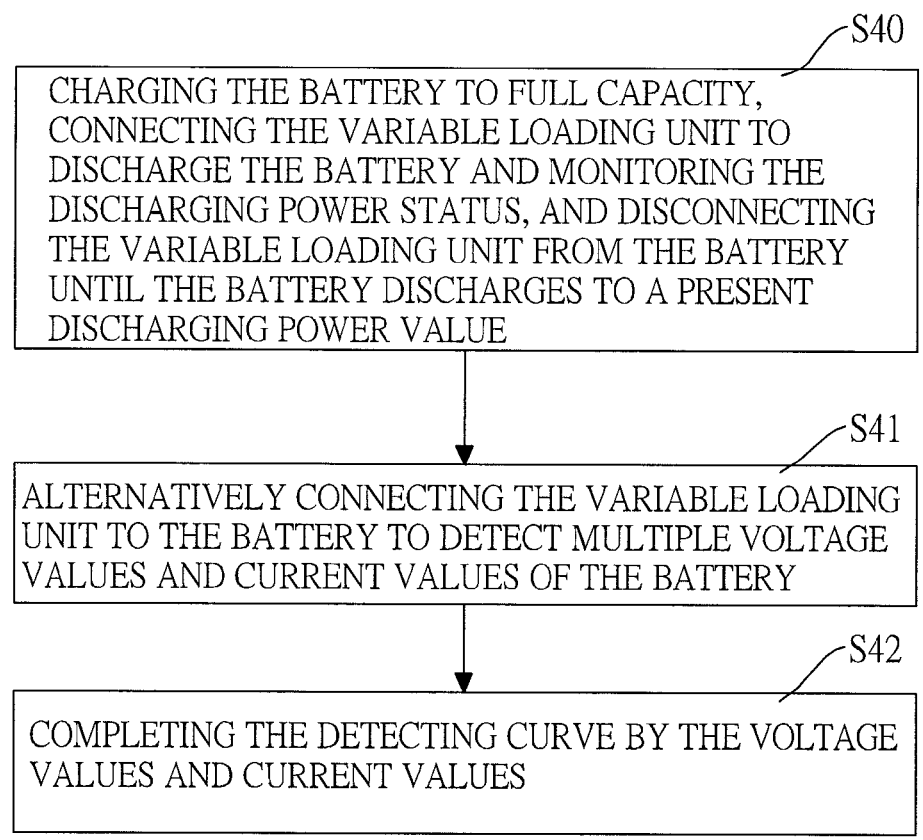
FIG. 8 is a flow chart of a detecting process in accordance with the present invention.

With reference to FIGS. 1, 7 and 8, the detecting waveform obtained by the microprocessor 20 and the flow chart of the detecting process are shown. In detecting process, the battery 30 is first charged to full capacity and just removed from a charger. The variable loading unit 21 is then connected to the battery 30. The microprocessor 20 detects a discharging power of the battery 30 through the variable loading unit 21 and monitors whether a discharging power of the battery 30 achieves a present power vale ($V_{e2}$). When the discharging power achieves the present power value, the switches 21C are removed from the battery so the variable loading unit 21 is disconnected from the battery (S40). Therefore, the battery 30 has no surface charge voltage. Then, the variable loading unit 21 is alternatively connected to the battery 30 to detect multiple voltage values and current values of the battery 30 (S41). Finally, the detecting waveform is completed by the voltage values and/or current values and the microprocessor determines the health of the battery according to the detecting waveform (S42).

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

The invention claimed is:

1. A battery tester with high precision, comprising a casing having an input device and two detecting wires, a microprocessor, a variable loading unit and a battery power status detecting unit, wherein:
   the detecting wires are adapted to selectively connect to two electrodes of a battery;
   the variable loading unit electronically connected to the microprocessor and connected to the detecting wires; and
   the battery power status detecting unit is electronically connected to the microprocessor to detect a battery voltage and a battery current of the battery and to report the battery voltage and the battery current to the microprocessor; and the battery tester is characterized in
   the input device providing different options of $CCA_B$ and 1/N CCA, with at least 2 options for N, where N is variable; and the
   microprocessor storing a strategic decision process and the strategic decision process having steps of:
   - (a) obtaining the battery voltage $V_B$ of the battery and reading the $CCA_B$ and the 1/N CCA from the input device;
   - (b) calculating an equation of loading resistance with the CCAB, an initial battery voltage and the 1/N CCA to obtain a proper loading resistance for the batter and adjusting a resistance of the variable loading unit in accordance with the calculated loading resistance; and
   - (c) executing a detecting process to obtain a detecting waveform.

2. The battery tester as claimed in claim 1, wherein the variable loading unit is a variable resistor having:
   two ends respectively connected to the detecting wires; and
   one controlling end electronically connected to the microprocessor such that the microprocessor adjusts the resistance of the variable resistor.

3. The battery tester as claimed in claim 2, wherein the equation is:

$$\frac{V_B}{CCA_B \times \frac{1}{N}}.$$

4. The battery tester as claimed in claim 1, wherein the variable loading unit has multiple resistors and multiple switches electronically connected to the microprocessor, wherein one end of each resistor is connected to one of the detecting wires, and the other end of the resistors are respectively connected to the other detecting wire through the switches.

5. The battery tester as claimed in claim 1, wherein the variable loading unit has:
   multiple resistors connected in serial to be a series of the resistors, wherein one end of the series of the resistors is connected to one of the detecting wires; and
   a multiplexer having:
   a common terminal connected to the other detecting wire;
   multiple switching terminals respectively connected to serial nodes of the series of the resistors and the other end of the series of the resistors; and
   a controlling terminal electronically connected to the microprocessor, such that the microprocessor drives the multiplexer to determine which one of the switching terminals is connected to the common terminal.

6. The battery tester as claimed in claim 1, wherein the variable loading unit has:
   a programmable variable resistor having a controlling end electronically connected to the microprocessor; and
   a switch connected between the programmable variable resistor and the detecting wire, and electronically connected to the microprocessor.

7. The battery tester as claimed in claim 1, wherein the variable loading unit has:
   a programmable variable resistor having:
   two ends respectively connected to the detecting wires; and a controlling end electronically connected to the microprocessor;

a buffer electronically connected between the microprocessor and controlling end of the programmable variable resistor; and a switch connected between one end of the programmable variable resistor and the detecting wire, and electronically connected to the microprocessor.

8. The battery tester as claimed in claim 3, wherein the detecting process has steps of:
  (a) charging the battery to full capacity and then removing the battery from a charger;
  (b) connecting the variable loading unit to the battery to discharge the battery and monitoring a discharging power;
  (c) disconnecting the variable loading unit from the battery when the discharging power meets a power threshold;
  (d) alternatively connecting the variable loading unit to the battery to detect multiple voltage values and current values of the battery; and
  (e) completing the detecting waveform by the voltage values and current values.

9. The battery tester as claimed in claim 1, wherein the casing further comprises a display, a computer connector and an alarm.

* * * * *